(12) United States Patent
Oh

(10) Patent No.: US 10,678,387 B2
(45) Date of Patent: Jun. 9, 2020

(54) DISPLAY DEVICE INCLUDING TOUCH SENSOR HAVING UNEVEN SURFACE WITH CONCAVE-CONVEX PATTERN IN BENDING AREA

(71) Applicant: LG Display Co., Ltd., Seoul (KR)

(72) Inventor: Jae Young Oh, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/954,060

(22) Filed: Apr. 16, 2018

(65) Prior Publication Data

US 2018/0321764 A1 Nov. 8, 2018

(30) Foreign Application Priority Data

May 8, 2017 (KR) .......................... 10-2017-0057311

(51) Int. Cl.
  *G06F 3/044* (2006.01)
  *H01L 27/32* (2006.01)
  *H01L 51/00* (2006.01)
  *H01L 51/52* (2006.01)

(52) U.S. Cl.
  CPC ............ *G06F 3/044* (2013.01); *H01L 27/322* (2013.01); *H01L 27/3276* (2013.01); *H01L 51/0097* (2013.01); *H01L 51/5253* (2013.01); *G06F 2203/04102* (2013.01); *G06F 2203/04111* (2013.01); *H01L 27/323* (2013.01); *H01L 51/5284* (2013.01); *H01L 2251/5338* (2013.01)

(58) Field of Classification Search
  CPC ..... G06F 3/041; G06F 3/044; H01L 27/1288; G02F 1/13338
  See application file for complete search history.

(56) References Cited

U.S. PATENT DOCUMENTS

| 2014/0368761 | A1* | 12/2014 | Lin | .......................... G06F 3/041 349/12 |
| 2016/0306462 | A1* | 10/2016 | Park | ......................... G06F 3/044 |
| 2017/0133413 | A1* | 5/2017 | Park | .................... H01L 27/1288 |
| 2017/0269749 | A1* | 9/2017 | Bok | ..................... G02F 1/13338 |
| 2018/0039352 | A1* | 2/2018 | Wu | ...................... H01L 51/0097 |

* cited by examiner

*Primary Examiner* — Kevin M Nguyen
(74) *Attorney, Agent, or Firm* — Polsinelli PC

(57) ABSTRACT

Disclosed is a display device capable of exhibiting improved reliability and stability. The display device includes an uneven part, which is disposed on a bending area of an upper substrate, on which a touch sensor is disposed. Therefore, each of routing lines disposed on the uneven part has an uneven surface that is formed along the uneven part within the bending area. Accordingly, cracking or disconnection of the routing lines is prevented during bending of the display device, and consequently reliability and stability are improved.

20 Claims, 8 Drawing Sheets

DISPLAY DEVICE INCLUDING TOUCH SENSOR HAVING UNEVEN SURFACE WITH CONCAVE-CONVEX PATTERN IN BENDING AREA

CROSS-REFERENCE TO RELATED APPLICATION

This application claims the benefit of Korean Patent Application No. 10-2017-0057311, filed on May 8, 2017, which is hereby incorporated by reference in its entirety as if fully set forth herein.

BACKGROUND

Field of the Disclosure

The present disclosure relates to a display device, and more particularly to a display device capable of improving reliability and stability.

Description of the Background

A touch screen is a type of input device that allows a user to input a command by selecting an instruction displayed on a screen of a display device with a hand or using an object. The touch screen converts a contact position, which is directly contacted by a user's hand or an object, into an electrical signal, and receives the instruction selected at the contact position as an input signal. Such a touch screen can eliminate a separate input device, such as a keyboard, a mouse, or the like, which is connected to a display device, thereby broadening the application field thereof.

The touch screen is generally attached to the front surface of a display panel such as a liquid crystal display panel or an organic electroluminescent display panel. Recently, the touch screen is being utilized in various display fields. For example, the touch screen is attached to a display panel of a flexible display device, which is capable of displaying images even when being bent like paper. However, the flexible display device is subjected to stress due to such bending or folding. Further, stress can be concentrated on a bending area. Thus, disconnection or cracking may occur at routing lines of the touch screen that are arranged in the bending area, on which stress is concentrated, thereby deteriorating reliability and stability.

SUMMARY

Accordingly, the present disclosure is directed to a display device that substantially obviates one or more problems due to limitations and disadvantages of the prior art.

An object of the present disclosure is to provide a display device capable of exhibiting improved reliability and stability.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes an uneven part, which is disposed on a bending area of an upper substrate, on which a touch sensor is disposed. Therefore, each of routing lines disposed on the uneven part has an uneven surface that is formed along the uneven part within the bending area. Accordingly, cracking or disconnection of the routing lines is prevented during bending of the display device, and consequently reliability is improved.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Reference will now be made in detail to the aspects of the present disclosure, examples of which are illustrated in the accompanying drawings. Wherever possible, the same reference numbers will be used throughout the drawings to refer to the same or like parts.

Figure 1:
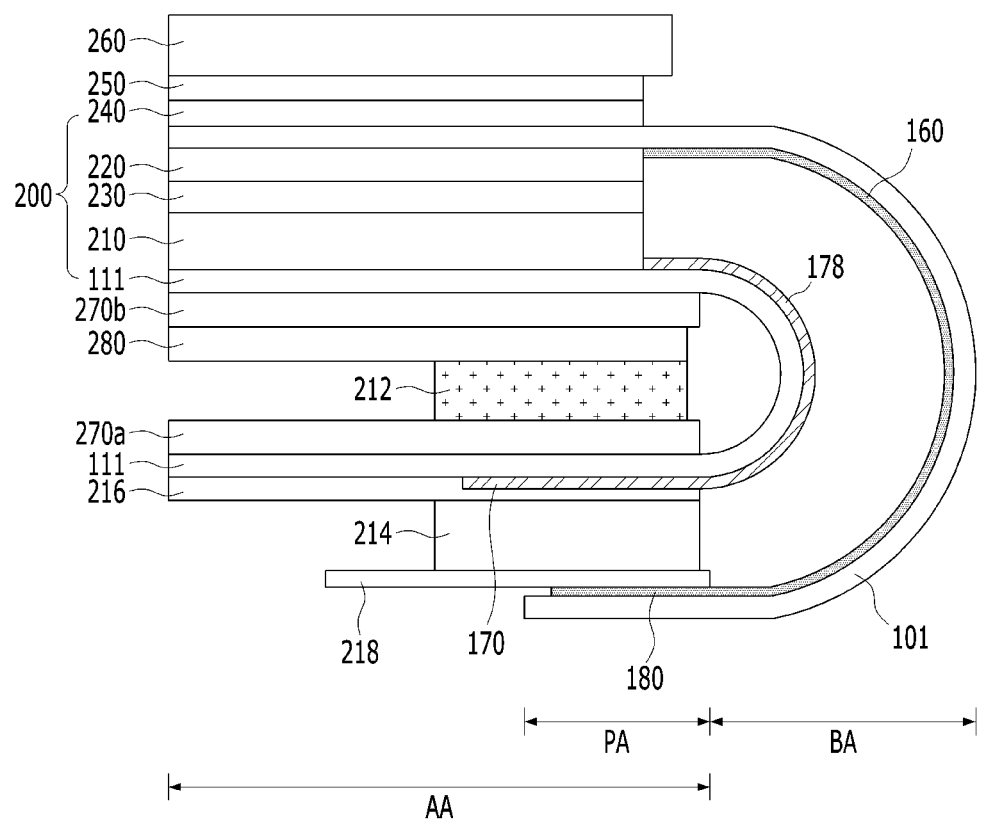
FIG. 1 is a cross-sectional view of a display device having a touch sensor according to an aspect of the present disclosure.

FIG. 1 is a cross-sectional view of a display device having a touch sensor according to the present disclosure.

The display device having the touch sensor depicted in FIG. 1 includes a cover film 260, a flexible display panel 200, and a back plate 280.

The cover film 260 is disposed to cover the front surface of the flexible display panel 200 using an adhesive layer 250, and protects the flexible display panel from external shocks. The cover film 260 is formed of tempered glass, which includes at least one of sapphire glass and Gorilla glass, or is formed of a plastic material, which is any one of polyethylene terephthalate (PET), polycarbonate (PC), polyethersulfone (PES), polyethylene naphthalate (PEN), and polynorbornene (PNB). The adhesive layer 250 is formed of an optical clear adhesive (OCA) or optical clear resin (OCR). A polarizing film 240 may be disposed between the cover film 260 and an upper flexible substrate 101, on which a touch sensor array 220 is formed. The polarizing film 240 serves to improve visibility by preventing reflection of light incident from the outside.

The back plate 280 is attached to the back surface of the flexible display panel 200. A first support film 270a is disposed between the bottom surface of the back plate 280 and a lower flexible substrate 111, and a second support film 270b is disposed between the top surface of the back plate 280 and the lower flexible substrate 111. The back plate 280 and the first and second support films 270a and 270b are attached to the bottom surface of an area of the flexible display panel 200 other than a bending area BA of the flexible display panel 200 in order to support the flexible display panel 200. The remaining area other than the bending area BA of the flexible display panel 200 is maintained in a planar state by the back plate 280 and the first and second support films 270a and 270b, and the bending area BA is bent to have a predetermined curvature. A gap-maintaining member 212 is disposed between the back plate 280 and the first support film 270a in order to maintain the curvature of the bending area BA.

The flexible display panel 200 includes an active area AA, the bending area BA, and a pad area PA.

A pixel array 210, a color array 230 and a touch sensor array 220 are disposed in the active area AA.

A plurality of routing lines 160, which is connected to respective touch electrodes of the touch sensor array 220, and a plurality of display signal links 178, which is connected to respective signal lines of the pixel array 210, are disposed in the bending area BA. At this time, the routing lines 160 and the display signal links 178 are arranged to face each other and are bent at a curvature of 0.5R or less in the bending area BA.

The pad area PA is located on the back surface of the active area AA, and a portion thereof overlaps the active area AA. Since the pad area PA is located on the back surface, which is opposite to the front surface of the display device, on which images are displayed, the pad area PA does not have an influence on the images. A touch pad 180, which is connected to the routing lines 160, and a display pad 170, which is connected to the display signal links 178, is disposed in the pad area PA. The touch pad 180 is bonded to a touch signal transmission film 218, on which a touch-driving part is mounted, through a film-on-glass (FOG) method or a tape-automated bonding (TAB) method. The display pad 170 is also bonded to a display signal transmission film 216, on which a display-driving part is mounted, through a film-on-glass (FOG) method or a tape-automated bonding (TAB) method. The display signal transmission film 216 is spaced apart from the touch signal transmission film 218, with a gap-maintaining member 214 interposed therebetween.

Figure 2:
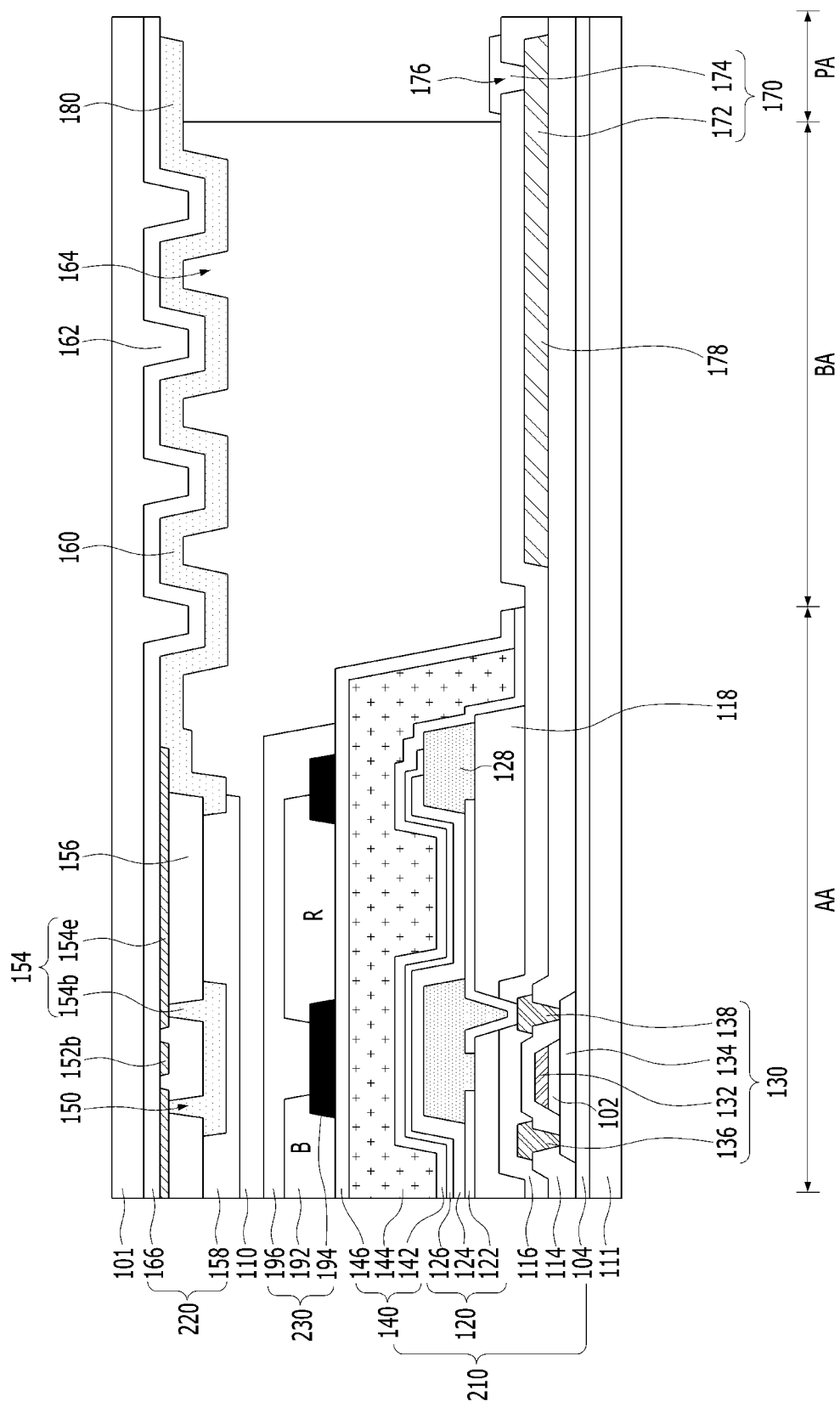
FIG. 2 is a cross-sectional view illustrating a flexible display panel depicted in FIG. 1 in detail.

FIG. 2 is a cross-sectional view illustrating the flexible display panel depicted in FIG. 1 in detail.

The flexible display panel 200 shown in FIG. 2 includes the upper flexible substrate 101 and the lower flexible substrate 111, which are arranged to face each other, and further includes the pixel array 210, the color array 230, and the touch sensor array 220.

Each of the upper and lower flexible substrates 101 and 111 is formed of a flexible material that can be bendable. For example, each of the upper and lower flexible substrates 101 and 111 may include polyimide, polyethylene terephthalate (PET), polycarbonate (PC), cyclic olefin polymer (COP), cellulose acetate propionate (CAP), polyethersulfone (PES), polyacrylate (PAR), polyetherimide (PEI), polyethylene naphthalate (PEN), polyphenylene sulfide (PPS), polyarylate, cellulose triacetate (TAC), etc. However, the present disclosure is not limited thereto. The display device, which includes the upper and lower flexible substrates 101 and 111, which are formed of a flexible and bendable material, can exhibit flexibility and rollability.

The pixel array 210 is disposed on the lower flexible substrate 111. The pixel array 210 displays an image through unit pixels each including a light-emitting unit 120. Each of the unit pixels includes a red (R) sub-pixel, a green (G) sub-pixel, and a blue (B) sub-pixel, or includes a red (R) sub-pixel, a green (G) sub-pixel, a blue (B) sub-pixel, and a white (W) sub-pixel.

To this end, as shown in FIG. 2, the pixel array 210 includes a plurality of sub-pixels, which are arranged in a matrix form on the active area AA of the lower flexible substrate 111, and an encapsulation unit 140, which is disposed on the sub-pixels.

Each of the sub-pixels includes a pixel-driving circuit and a light-emitting unit 120 connected to the pixel-driving circuit.

The pixel-driving circuit further includes a switching transistor, a driving transistor 130, and a storage capacitor.

When a scan pulse is supplied to a scan line, the switching transistor is turned on, and supplies a data signal, which was supplied to a data line, to the storage capacitor and to a gate electrode of the driving transistor. Here, the display pad 170 for supplying a driving signal to the scan line and the data line is disposed in the pad area PA. The display pad 170 includes a lower pad electrode 172 and an upper pad electrode 174, which are electrically connected to each other via a pad contact hole 176. The lower pad electrode 172 extends from the display signal links 178, which are connected to the scan line and the data line. The upper pad electrode 174 is electrically connected to the lower pad electrode 172, which is exposed through the pad contact hole 176, which penetrates through a protective film 116.

The driving transistor 130 adjusts the amount of light emitted from the light-emitting unit 120 by controlling current supplied from a high voltage (VDD) supply line to the light-emitting unit 120 in response to the data signal supplied to the gate electrode of the driving transistor 130. Even when the switching transistor is turned off, the driving transistor 130 supplies constant current due to the voltage charged in the storage capacitor until a data signal of a subsequent frame is supplied, thereby enabling the light-emitting unit 120 to continue to emit light.

As shown in FIG. 2, the driving thin-film transistor 130 includes a gate electrode 132, a semiconductor layer 134, which overlaps the gate electrode 132, with a gate insulation film 102 interposed therebetween, and source and drain electrodes 136 and 138, which are formed on an interlayer insulation film 114 and are in contact with the semiconductor layer 134. Here, the semiconductor layer 134 is formed on a buffer layer 104 formed of at least one of an amorphous semiconductor material, a polycrystalline semiconductor material, and an oxide semiconductor material.

The light-emitting unit 120 includes an anode electrode 122, at least one light-emitting stack 124 formed on the anode electrode 122, and a cathode electrode 126 formed on the light-emitting stack 124.

The anode electrode 122 is electrically connected to a drain electrode 138 of the driving thin-film transistor (T2) 130, which is exposed through a pixel contact hole, which penetrates through the protective film 116 and a lower planarization layer 118.

The at least one light-emitting stack 124 is formed on the anode electrode 122 in the light-emitting area, which is provided by a bank 128. The at least one light-emitting stack 124 is formed by stacking, on the anode electrode 122, a hole-related layer, an organic light-emitting layer, and an electron-related layer, either in that order or in the reverse order. In addition, the light-emitting stack 124 may include first and second light-emitting stacks, which are opposite to each other, with a charge generation layer (CGL) interposed therebetween. In this case, an organic light-emitting layer of any one of the first and second light-emitting stacks generates blue light, and an organic light-emitting layer of the remaining one of the first and second light-emitting stacks generates yellow-green light, with the result that white light is generated via the first and second light-emitting stacks. The white light generated by the light-emitting stack 124 is incident on a color filter (not shown) disposed on or under the light-emitting stack 124, and consequently a color image is realized. Alternatively, it may be possible to realize a color image in such a way that each light-emitting stack 124 generates colored light corresponding to each sub-pixel without a color filter. That is, a light-emitting stack 124 of a red (R) sub-pixel may generate red light, a light-emitting stack 124 of a green (G) sub-pixel may generate green light, and a light-emitting stack 124 of a blue (B) sub-pixel may generate blue light.

The cathode electrode 126 is formed opposite to the anode electrode 122, with the light-emitting stack 124 interposed therebetween, and is connected to a low voltage supply line (VSS).

The encapsulation unit 140 prevents permeation of external moisture or oxygen into the light-emitting unit 120, which is vulnerable to moisture or oxygen. To this end, the encapsulation unit 140 includes a plurality of inorganic encapsulation layers 142 and 146 and an organic encapsulation layer 144 interposed between the inorganic encapsulation layers 142 and 146. The inorganic encapsulation layer 146 is a top layer of the encapsulation unit 140. At this time, the encapsulation unit 140 includes at least two inorganic encapsulation layers 142 and 146 and at least one organic encapsulation layer 144. The present disclosure will now be described, by way of example, with reference to the configuration of the encapsulation unit 140 in which the organic encapsulation layer 144 is interposed between the first and second inorganic encapsulation layers 142 and 146.

The first inorganic encapsulation layer 142 is formed on the substrate 111, on which the cathode electrode 126 is formed, to be located adjacent to the light-emitting unit 120. The first inorganic encapsulation layer 142 is formed of an inorganic insulation material, which can be applied by a low-temperature deposition process, such as silicon nitride (SiNx), silicon oxide (SiOx), silicon oxynitride (SiON), and aluminum oxide ($Al_2O_3$). Accordingly, since the first inorganic encapsulation layer 142 is deposited under a low-temperature atmosphere, it is possible to prevent damage to the light-emitting stack 124, which is vulnerable to a high-temperature atmosphere, during the process of depositing the first inorganic encapsulation layer 142.

The organic encapsulation layer 144 serves to alleviate stress concentrated on the layers when the organic light-emitting display device is bent, and also serves to enhance the planarization performance. The organic encapsulation layer 144 is formed of an organic insulation material such as acrylic resin, epoxy resin, polyimide, polyethylene, and silicon oxycarbide (SiOC).

The second inorganic encapsulation layer 146 is formed to cover the top surface and the side surfaces of the organic encapsulation layer 144 and the top surface of the first inorganic encapsulation layer 142, which is exposed by the organic encapsulation layer 144. Accordingly, since the top, bottom and side surfaces of the organic encapsulation layer 144 are sealed by the first and second inorganic encapsulation layers 142 and 146, it is possible to minimize or prevent permeation of external moisture or oxygen into the organic encapsulation layer 144 and permeation of moisture or oxygen from the organic encapsulation layer 144 into the light-emitting unit 120. The second inorganic encapsulation layer 146 is formed of an inorganic insulation material such as silicon nitride (SiNx), silicon oxide (SiOx), silicon oxynitride (SiON), and aluminum oxide ($Al_2O_3$).

The color filter array 230 is disposed on the encapsulation unit 140, and includes color filters 192, black matrices 194, and an upper planarization layer 196.

The color filters 192 are formed between the touch sensor array 220 and the light-emitting unit 120. The touch sensor array 220 and the light-emitting unit 120 are distant from each other due to the color filters 192. Accordingly, it is possible to minimize parasitic capacitance between the touch sensor array 220 and the light-emitting unit 120, with the result that it is possible to prevent interaction between a touch sensor Cm and the light-emitting unit 120 attributable to coupling therebetween.

The black matrices 194 are disposed between the color filters 192. The black matrices 194 serve to separate the sub-pixel regions from each other and to prevent light interference and light leakage between the adjacent sub-pixel regions. The black matrices 194 are formed of a black insulation material having high resistance characteristics, or are formed by stacking at least two of red (R), green (G) and blue (B) color filters 192. In addition, the upper planarization layer 196 is formed on the lower flexible substrate 111, on which the color filters 192 and the black matrices 194 are formed. The upper planarization layer 196 planarizes the lower flexible substrate 111, on which the color filters 192 and the black matrices 194 are formed.

The touch sensor array 220 is disposed on the upper flexible substrate 101. The upper flexible substrate 101, on which the touch sensor array 220 is formed, is attached onto the lower flexible substrate 111, on which the light-emitting unit 120 and the color filter array 230 are formed, via an adhesive layer 110. The adhesive layer 110 is disposed between the display signal links 178 and the routing lines 160. At this time, the size of the contact area between the adhesive layer 110 and the routing lines 160 is increased by the routing lines 160, each having an uneven surface, and accordingly the adhesive force of the adhesive layer 110 is maintained when the display device is bent. The adhesive layer 110 is formed of an optical clear adhesive (OCA) or optical clear resin (OCR).

Figure 3:
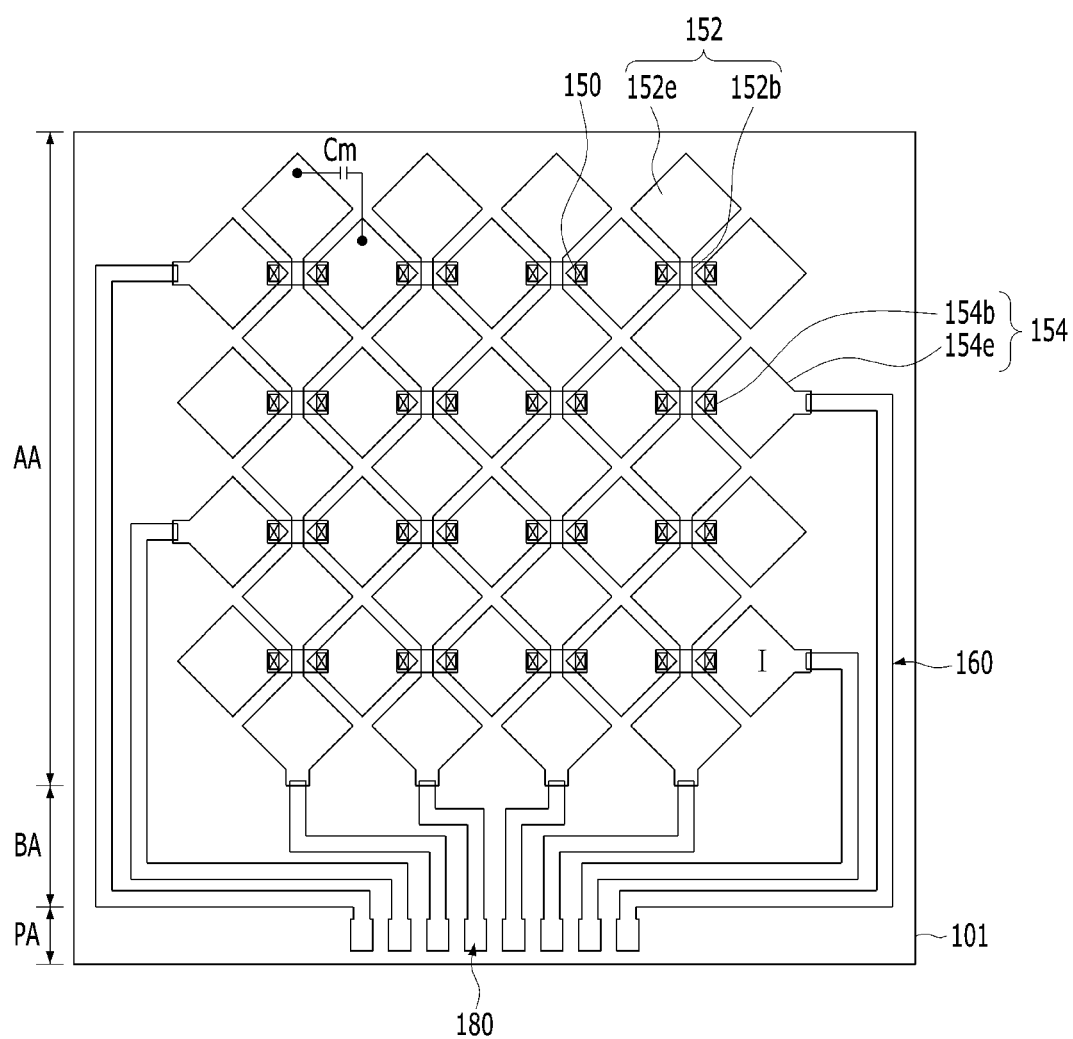
FIG. 3 is a plan view of a touch sensor array depicted in FIG. 2.

As shown in FIGS. 2 and 3, the touch sensor array 220 includes a touch-sensing line 154 and a touch-driving line 152, which intersect each other, with a touch insulation film 156 interposed therebetween. Mutual capacitance Cm, which enables touch sensing, is formed at the intersection between the touch-sensing line 154 and the touch-driving line 152. Accordingly, the mutual capacitance Cm serves as a touch sensor by charging electric charges based on a touch-driving pulse supplied to the touch-driving line 152 and discharging the charged electric charges to the touch-sensing line 154.

The touch-driving line 152 includes a plurality of first touch electrodes 152*e* and a plurality of first bridges 152*b* for electrically interconnecting the first touch electrodes 152*e*.

The first touch electrodes 152*e* are arranged on a touch buffer film 166 to be spaced a constant distance apart from each other in a Y direction, which is a first direction. Each of the first touch electrodes 152*e* is electrically connected to the first touch electrode 152*e*, which is located adjacent thereto, via each of the first bridges 152*b*.

The first bridges 152*b* are disposed on the same plane as the first touch electrodes 152*e*, that is, are disposed on the touch buffer film 166, and are electrically connected to the first touch electrodes 152e without a separate contact hole.

The touch-sensing line 154 includes a plurality of second touch electrodes 154e and a plurality of second bridges 154b for electrically interconnecting the second touch electrodes 154e.

The second touch electrodes 154e are arranged on the touch buffer film 166 to be spaced a constant distance apart from each other in an X direction, which is a second direction. Each of the second touch electrodes 154e is electrically connected to the second touch electrode 154e, which is located adjacent thereto, via each of the second bridges 154b.

The second bridges 154b are formed on the touch insulation film 156, are exposed through touch contact holes 150 that penetrate the touch insulation film 156, and are electrically connected to the second touch electrodes 154e. Like the first bridges 152b, the second bridges 154b are arranged to overlap the bank 128. Therefore, it is possible to prevent an opening ratio from being deteriorated by the first and second bridges 152b and 154b.

A touch protective film 158 is disposed on the touch insulation film 156, on which the second bridges 154b are formed. The touch protective film 158 is formed of an inorganic or organic insulation material, and protects the touch-driving line 152 and the touch-sensing line 154.

In the present disclosure, each of the touch-driving line 152 and the touch-sensing line 154 is connected to a touch-driving unit (not shown) via the routing lines 160 and the touch pad 180.

The touch pad 180 extends from the routing lines 160 to the pad area PA, and is formed on the touch buffer film 166.

The routing lines 160 transmit a touch-driving pulse generated from the touch-driving unit to the touch-driving line 152 through the touch pad 180, and transmit a touch signal from the touch-sensing line 154 to the touch pad 180.

The routing lines 160 are disposed between each of the first and second touch electrodes 152e and 154e and the touch pad 180 to be connected to these components 152e, 154e and 180. That is, as shown in FIG. 2, the routing lines 160 are connected to the first and second touch electrodes 152e and 154e, which are exposed by the touch insulation film 156. Further, the routing lines 160 extend to the pad area PA and are connected to the touch pad 180. The routing lines 160 connected to the first touch electrodes 152e, as shown in FIG. 3, extend to at least one of the upper side and the lower side of the active area AA, and are connected to the touch pad 180. The routing lines 160 connected to the second touch electrodes 154e extend to at least one of the left side and the right side of the active area AA, and are connected to the touch pad 180. However, the arrangement of the routing lines 160 is not limited to the arrangement shown in FIG. 3, and may be variously modified depending on the design specification of the display device.

Figure 4A:
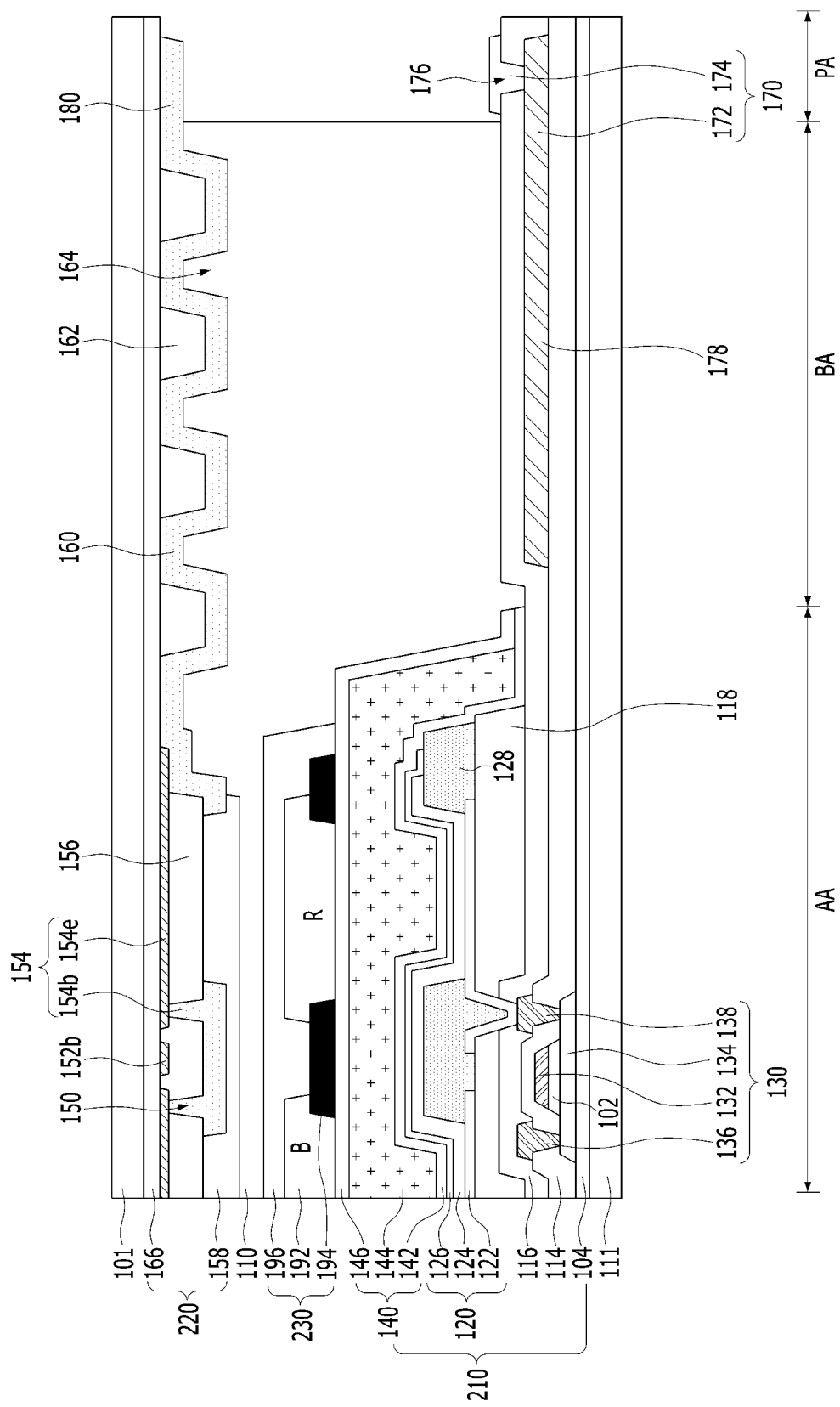
FIGS. 4A and 4B are cross-sectional views illustrating other aspects of an uneven part depicted in FIG. 2.
Figure 4B:
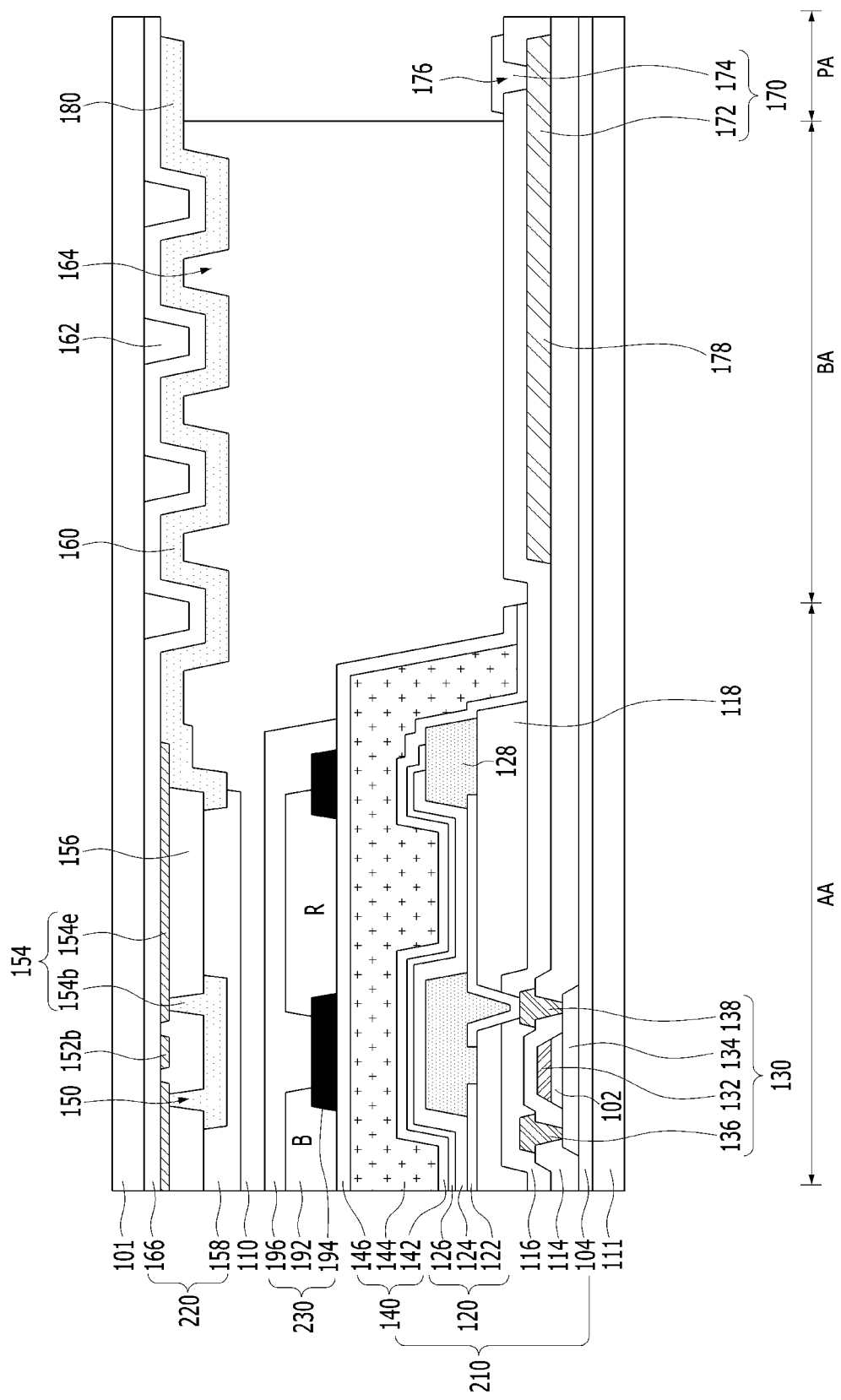

The routing lines 160 are disposed in the bending area BA provided between the active area AA and the pad area PA in the flexible display panel. Each of the routing lines 160, as shown in FIGS. 2, 4A and 4B, has an uneven surface, which is formed along an uneven part, which is disposed under the routing lines 160 and which includes concave portions 164 and convex portions 162. At this time, the uneven part including the concave portions 164 and the convex portions 162 is disposed inside the portion that is bent with a predetermined curvature.

The routing lines 160 shown in FIG. 2 are disposed on the upper flexible substrate 101, which has concave portions 164 and convex portions 162 that are alternately arranged within the bending area BA. The concave portions 164 and the convex portions 162 are directly formed at the upper flexible substrate 101 via a dry etching process. At this time, the convex portions 162 are formed of the same material as the upper flexible substrate 101, and protrude from the upper flexible substrate 101 toward the routing lines 160. The concave portions 164 are disposed between the convex portions 162, and expose the surface of the upper flexible substrate 101. The touch buffer film 166, which is disposed on the upper flexible substrate 101 having the convex portions 162 and the concave portions 164, has an uneven surface within the bending area BA. Each of the routing lines 160, which are disposed on the touch buffer film 166 having the uneven surface, also has an uneven surface within the bending area BA.

The routing lines 160 shown in FIG. 4A are formed on the touch buffer film 166, which has concave portions 164 and convex portions 162 within the bending area BA. At this time, the convex portions 162 are formed of the same organic insulation material as the touch insulation film 156, and protrude from the touch buffer film 166 toward the routing lines 160. The concave portions 164 are disposed between the convex portions 162, and expose the surface of the touch buffer film 166. Accordingly, each of the routing lines 160 has an uneven surface within the bending area BA.

The routing lines 160 shown in FIG. 4B are formed on the touch buffer film 166, which is disposed to cover concave portions 164 and convex portions 162 within the bending area BA. At this time, the convex portions 162 are formed of an inorganic or organic insulation material, and protrude from the upper flexible substrate 101 toward the routing lines 160. The concave portions 164 are disposed between the convex portions 162, and expose the surface of the upper flexible substrate 101. Accordingly, the touch buffer film 166, which is disposed on the upper flexible substrate 101 having the concave portions 164 and the convex portions 162, has an uneven surface within the bending area BA. Each of the routing lines 160, which are disposed on the touch buffer film 166, also has an uneven surface within the bending area BA.

As described above, in the present disclosure, each of the routing lines 160 has an uneven surface, which is formed along the uneven part disposed within the bending area BA. Therefore, the surface area of each of the routing lines 160 is increased compared to the prior art, which has no uneven part. With the increase in the surface area of the routing lines 160, the stress applied to the routing lines 160 during the bending of the bending area is reduced, thereby preventing cracking or disconnection of the routing lines 160. As a result, the present disclosure is capable of preventing permeation of external moisture or oxygen through cracks, thereby improving the reliability and stability of a product.

Figure 5:
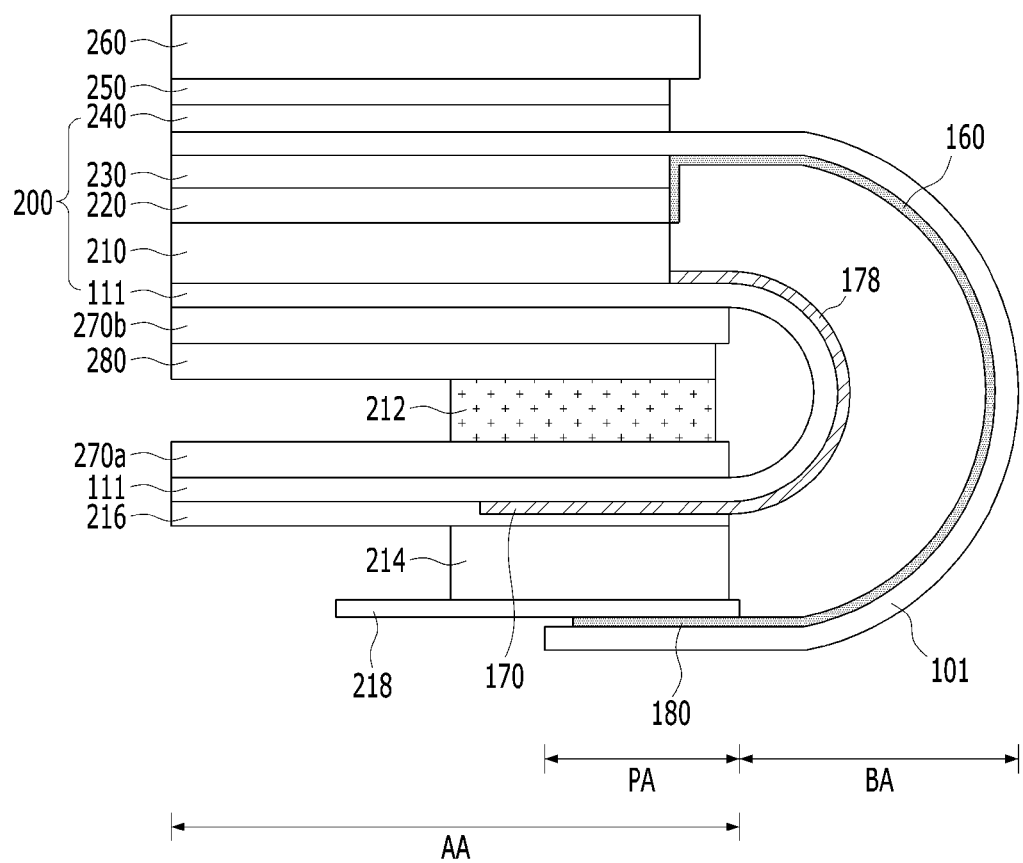
FIG. 5 is a cross-sectional view of a display device having a touch sensor according to another aspect of the present disclosure.

FIG. 5 is a cross-sectional view of a display device according to a second aspect of the present disclosure.

The display device shown in FIG. 5 has substantially the same configuration as the display device shown in FIG. 1, except that a color filter array 230 is disposed between an upper flexible substrate 101 and a touch sensor array 220. A detailed description of the same configuration will be omitted.

Figure 6:
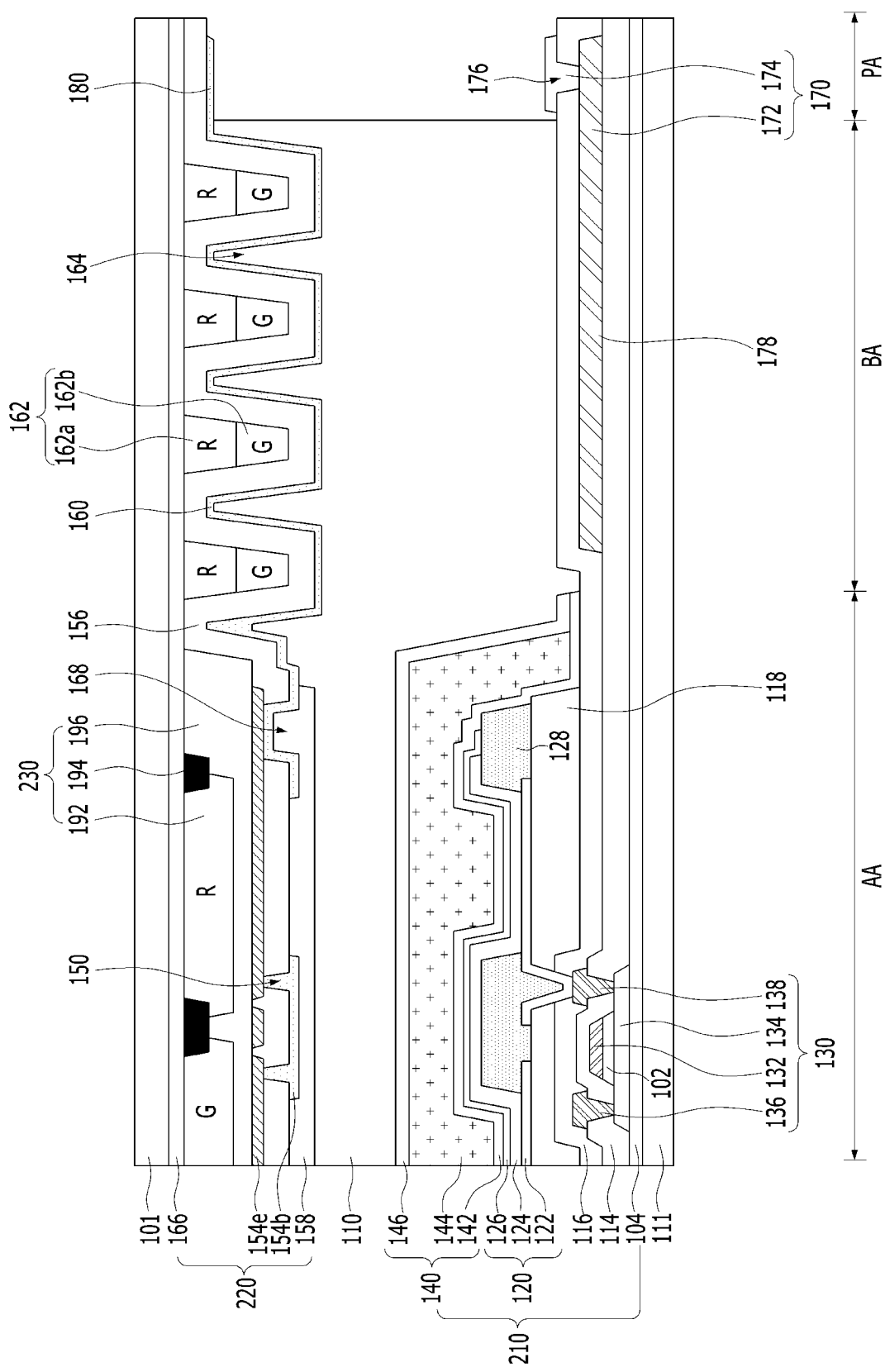
FIG. 6 is a cross-sectional view illustrating a flexible display panel depicted in FIG. 5 in detail.

The color filter array 230, as shown in FIG. 6, is disposed on a touch buffer film 166, and includes color filters 192, black matrices 194, and an upper planarization layer 196.

The color filters 192 are formed between the touch sensor array 220 and the touch buffer film 166. Each of the color filters 192 is disposed on the touch buffer film 166 within the active area AA to overlap a light-emitting area provided by a bank 128, thereby realizing an image of a corresponding color.

Routing lines 160 are disposed on the bending area of the upper flexible substrate 101, on which the color filters 192 are disposed. The routing lines 160 are connected to first and second touch electrodes 152e and 154e, which are exposed through routing contact holes 168 that penetrate a touch insulation film 156.

An uneven part, which has concave portions 164 and convex portions 162, is disposed under the routing lines 160. Each of the convex portions 162 is formed on the touch buffer film 166 in an at least one-layer structure using the same material as at least one of the color filters 192, the black matrices 194, and the upper planarization layer 196. For example, each of the convex portions 162 includes a first convex portion 162a, formed of the same material as the red (R) color filter 192, and a second convex portion 162b, formed of the same material as the green (G) color filter 192. At this time, since the line width of each of the convex portions 162 gradually decreases as each of the convex portions 162 becomes farther from the touch buffer film 166, the line width of the second convex portion 162b is less than the line width of the first convex portion 162a.

The convex portions 162 are spaced a predetermined distance apart from each other on the touch buffer film 166, with the concave portions 164 interposed therebetween. The touch insulation film 156, which is formed to cover the convex portions 162, has an uneven surface within the bending area BA. Each of the routing lines 160, which are disposed on the touch insulation film 156 having the uneven surface, also has an uneven surface within the bending area BA.

As described above, in the present disclosure, each of the routing lines 160 has an uneven surface, which is formed along the uneven part disposed within the bending area BA. Therefore, the surface area of each of the routing lines 160 is increased compared to the prior art, which has no uneven part. With the increase in the surface area of the routing lines 160, the stress applied to the routing lines 160 during the bending of the bending area is reduced, thereby preventing cracking or disconnection of the routing lines 160. As a result, the present disclosure is capable of preventing permeation of external moisture or oxygen through cracks, thereby improving the reliability and stability of a product.

Figure 7:
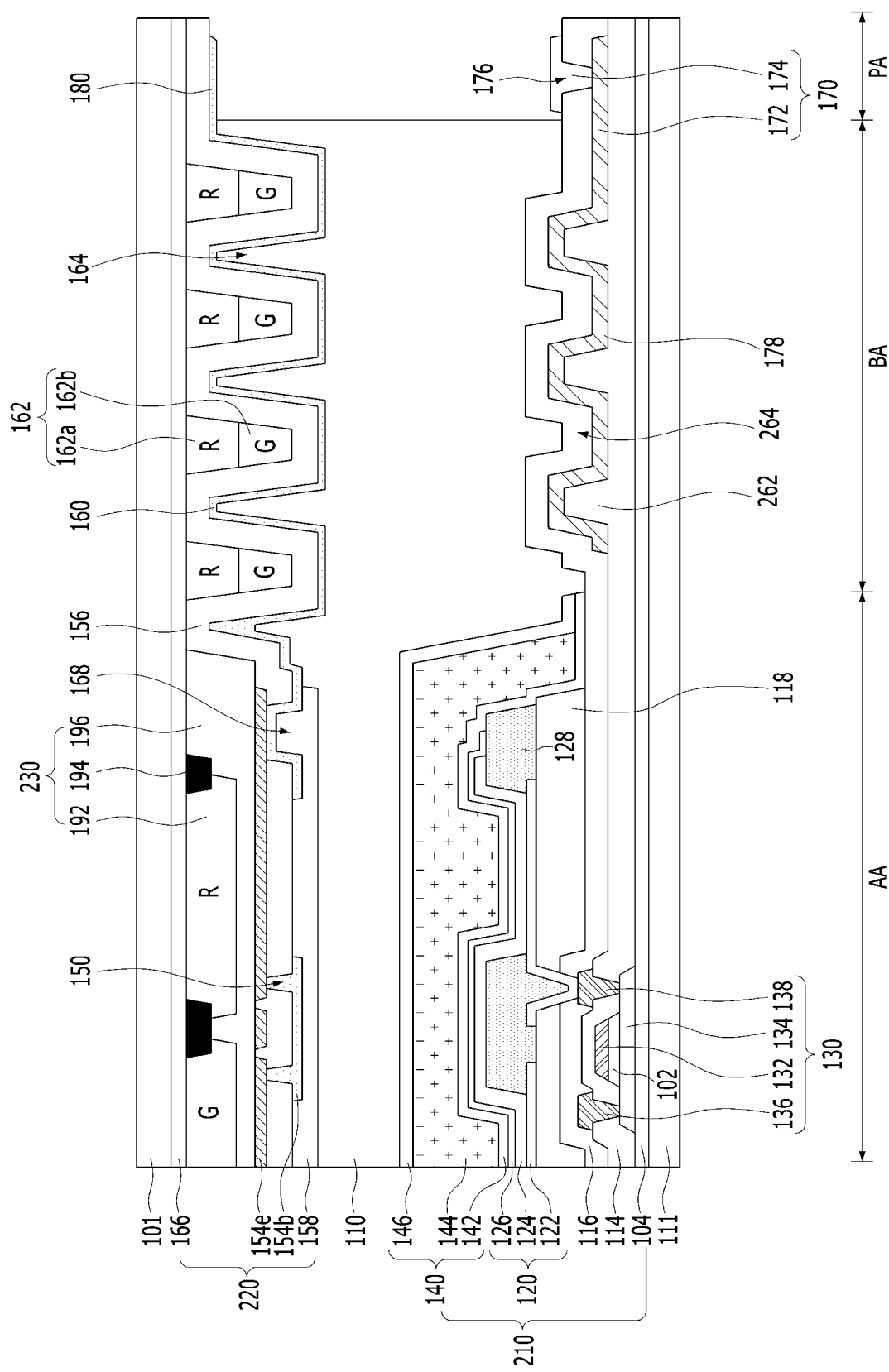
FIG. 7 is a cross-sectional view illustrating another aspect of the flexible display panel depicted in FIG. 5.

The present disclosure has been described above, by way of example, with reference to the configuration in which the uneven part having the concave portions 164 and the convex portions 162 is formed under the routing lines 160. However, as shown in FIG. 7, a second uneven part, which has concave portions 264 and convex portions 262, may be formed under display signal links 178. The second uneven part is formed of the same material as an insulation film disposed under the display signal links through the same or a separate mask process. For example, the convex portions 262 are formed on a buffer film 104 using the same material as an interlayer insulation film 114. At this time, the second uneven part having the convex portions 262 and the concave portions 264 is formed outside the portion that is bent with a predetermined curvature. Each of the display signal links 178, which are disposed on the interlayer insulation film 114 via the second uneven part, has an uneven surface within the bending area BA, and the surface area thereof is thus increased. Therefore, disconnection of the display signal links 178 may be prevented. At this time, the convex portions 162 disposed on the upper flexible substrate 101 and the convex portions 262 disposed on the lower flexible substrate 111 may be arranged to be aligned with each other or misaligned from each other.

In addition, although the present disclosure has been described as being applied to the mutual-capacitance type touch sensor, the present disclosure may also be applied to a self-capacitance type touch sensor Cs.

As is apparent from the above description, the present disclosure provides a display device that includes an uneven part, which is disposed on a bending area of an upper flexible substrate. Since each of routing lines disposed on the uneven part has an uneven surface that is formed along the uneven part, the surface area thereof is increased. Therefore, cracking or disconnection of the routing lines may be prevented. In addition, since the routing lines are disposed on the bending area having an uneven surface, stress applied to the bending area is greatly alleviated, and accordingly disconnection of the routing lines may be prevented.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display device comprising:
   a touch sensor disposed on an upper substrate;
   a light-emitting unit disposed on a lower substrate facing the upper substrate;
   an uneven part disposed on the upper substrate within a bending area of the upper substrate;
   a routing line connected to the touch sensor and having an uneven surface that is formed along the uneven part within the bending area; and
   a touch buffer film disposed between the upper substrate and each of the touch sensor and the routing line,
   wherein the touch buffer film overlaps the light-emitting unit disposed on the lower substrate.

2. The display device according to claim 1, wherein the uneven part comprises:
   a plurality of convex portions protruding toward the routing line; and
   a plurality of concave portions disposed between the plurality of convex portions.

3. The display device according to claim 2, wherein the plurality of convex portions protrudes from the upper substrate and are formed of a same material as the upper substrate.

4. The display device according to claim 2, wherein the touch sensor comprises:
   a plurality of first and second touch electrodes disposed on the upper substrate;
   a first bridge connecting the plurality of first touch electrodes; and
   a second bridge connecting the plurality of second touch electrodes.

5. The display device according to claim 4, further comprising:
   a touch insulation film disposed between the first bridge and the second bridge,
   wherein the touch buffer film is disposed on the upper substrate between the first and second touch electrodes; and
   wherein the plurality of convex portions is formed on the touch buffer film and is formed of a same material as the touch insulation film.

6. The display device according to claim 2, wherein the plurality of convex portions is disposed on the upper substrate, and
wherein the routing line is disposed on the touch buffer film that is disposed to cover the plurality of convex portions.

7. The display device according to claim 1, further comprising:
an encapsulation unit disposed on the lower substrate to cover the light-emitting unit; and
a plurality of color filters disposed on the encapsulation unit.

8. The display device according to claim 2, further comprising:
an encapsulation unit disposed on the lower substrate to cover the light-emitting unit;
a plurality of color filters disposed between the touch sensor and the upper substrate;
a black matrix disposed between the plurality of color filters; and
a planarization layer disposed to cover the color filters and the black matrix.

9. The display device according to claim 8, wherein each of the convex portions is formed of one or more layers and is formed of a same material as at least one of the color filters, the black matrix, and the planarization layer.

10. A bendable display device having a bending area comprising:
a touch sensor array having a touch buffer film and disposed on an upper substrate;
a light-emitting unit disposed on a lower substrate facing the upper substrate; a color filter array having a color filter, a black matrix and an upper planarization layer and disposed on the touch buffer film;
a plurality of first convex portions disposed on the touch buffer film within the bending area;
a plurality of second convex portions disposed on the plurality of first concave portions;
a plurality of first concave portions disposed between the plurality of first and second convex portions; and
a routing line connected to the touch sensor array and formed over the first and second convex portions.

11. The bendable display device according to claim 10, wherein the first and second concave portions are formed of a same material as the color filter.

12. The bendable display device according to claim 11, wherein the first and second concave portions are formed of a red color filter and a green color filter, respectively.

13. The display device according to claim 10, wherein the touch sensor array comprises:
a plurality of first and second touch electrodes disposed on the upper substrate;
a first bridge connecting the plurality of first touch electrodes; and
a second bridge connecting the plurality of second touch electrodes.

14. The display device according to claim 13, further comprising a touch insulation film disposed between the first bridge and the second bridge.

15. The display device according to claim 10, further comprising a plurality of third convex portions disposed at the lower substrate within the bending area and a plurality of second concave portions disposed between the plurality of third convex portions.

16. The display device according to claim 15, further comprising a plurality of display signal links disposed to cover the plurality of third convex portions.

17. A bendable display device having a bending area comprising:
a touch sensor array having a touch buffer film and disposed on an upper substrate;
a light-emitting unit disposed on a lower substrate facing the upper substrate;
a color filter array having a color filter, a black matrix and an upper planarization layer and disposed on the touch buffer film;
a plurality of first convex portions disposed on the touch buffer film within the bending area;
a plurality of second convex portions disposed on the plurality of first concave portions;
a plurality of first concave portions disposed between the plurality of first and second convex portions;
a routing line connected to the touch sensor array and formed over the first and second convex portions;
a plurality of third convex portions disposed at the lower substrate within the bending area; and
a plurality of second concave portions disposed between the plurality of third convex portions.

18. The bendable display device according to claim 17, further comprising an interlayer insulation film between the lower substrate and the plurality of third convex portions.

19. The bendable display device according to claim 18, wherein the plurality of third convex portions is formed of a same material as the interlayer insulation film.

20. The bendable display device according to claim 18, further comprising a buffer film between the interlayer insulation film and the lower substrate.

* * * * *